United States Patent
White

(10) Patent No.: US 6,435,941 B1
(45) Date of Patent: Aug. 20, 2002

(54) APPARATUS AND METHOD FOR CHEMICAL MECHANICAL PLANARIZATION

(75) Inventor: John M. White, Hayward, CA (US)

(73) Assignee: Appllied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/570,591

(22) Filed: May 12, 2000

(51) Int. Cl.$^7$ .............................................. B24B 49/00
(52) U.S. Cl. .......................... 451/5; 451/288; 451/285; 451/287; 451/339
(58) Field of Search ............................. 451/5–10, 285, 451/288, 287, 289, 270, 339

(56) References Cited

U.S. PATENT DOCUMENTS

| | | | |
|---|---|---|---|
| 5,335,453 A | | 8/1994 | Baldy et al. |
| 5,738,574 A | | 4/1998 | Tolles et al. |
| 5,804,507 A | | 9/1998 | Perlov et al. |
| 5,908,347 A | * | 6/1999 | Nakajima et al. ............... 451/5 |
| 5,908,530 A | | 6/1999 | Hoshizaki et al. |
| 6,110,024 A | * | 8/2000 | Togawa ....................... 451/285 |
| 6,227,946 B1 | * | 5/2001 | Gonzalez-Martin et al. .. 451/54 |
| 6,227,950 B1 | * | 5/2001 | Hempel et al. ............. 451/288 |
| 6,241,585 B1 | * | 6/2001 | White .......................... 451/41 |
| 6,296,550 B1 | * | 10/2001 | Liu et al. ....................... 451/41 |
| 6,302,767 B1 | * | 10/2001 | Tietz ........................... 451/41 |

OTHER PUBLICATIONS

Tobin, J. "Edge Contact Loadcup" U.S. patent application No. 09/414,907 filed Oct. 8, 1999.

Ettinger et al. "Method and Apparatus for Transferring Semiconductor Wafer Using an Input Module" U.S. patent application No. 09/547,189 filed Apr. 11, 2000.

White et al. "Planarization System with Multiple Polishing Pads" U.S. patent application No. 09/556,495 filed Apr. 21, 2000.

Donohue et al. "Polishing Media Magazine for Improved Polishing" U.S. patent application No. 08/833,279 filed Apr. 4, 1997.

Sommer, P. "Linear Drive System for Chemical Mechanical Polishing" U.S. patent application No. 08/961,602 filed Oct. 31, 1997.

* cited by examiner

Primary Examiner—Joseph J. Hail, III
Assistant Examiner—Lee Wilson
(74) Attorney, Agent, or Firm—Moser, Patterson & Sheridan

(57) ABSTRACT

Generally, a semiconductor wafer processing system and more specifically, a semiconductor wafer planarization system for polishing a workpiece, such as a semiconductor substrate or wafer. The system generally includes a first polishing module that has a polishing head for retaining a workpiece, a staging module and a set of load cups for transferring the workpiece to and from the polishing head. A primary robot that has a workpiece gripper transfers the workpiece between the first set of load cups and the staging module. The staging module and the load cups comprise transfer locations where processed and unprocessed workpieces may be set within the reach of processing modules and transfer devices so that the dwell time associated with handling polished and unpolished workpieces is reduced. Additionally, a method for transferring wafers about the polishing system is also disclosed.

27 Claims, 9 Drawing Sheets

APPARATUS AND METHOD FOR CHEMICAL MECHANICAL PLANARIZATION

BACKGROUND OF THE DISCLOSURE

1. Field of Invention

The present invention relates generally to a substrate planarization system and a method for processing a substrate.

2. Background of Invention

In semiconductor wafer processing, the use of chemical mechanical planarization, or CMP, has gained favor due to the enhanced ability to stack multiple devices on a semiconductor workpiece, or substrate, such as a wafer. As the demand for planarization of layers formed on wafers in semiconductor fabrication increases, the requirement for greater system (i.e., process tool) throughput with less wafer damage and enhanced wafer planarization has also increased.

Two exemplary CMP systems that address these issues are described in U.S. Pat. No. 5,804,507, issued Sep. 8, 1998 to Perlov et al. and in U.S. Pat. No. 5,738,574, issued Apr. 15, 1998 to Tolles et al., both of which are hereby incorporated by reference. Perlov et al. and Tolles et al. disclose a CMP system having a planarization apparatus that is supplied wafers from cassettes located in an adjacent liquid filled bath. A transfer mechanism, or robot, facilitates the transfer of the wafers from the bath to a transfer station. The transfer station generally contains a load cup that positions the wafer into one of four processing heads mounted to a carousel. The carousel moves each processing head sequentially over the load cup to receive a wafer. As the processing heads fill, the carousel moves the processing head and wafer through the planarization stations for polishing. The wafers are planarized by moving the wafer relative to a polishing pad in the presence of a slurry or other polishing fluid medium.

The polishing pad may include an abrasive surface. Additionally, the slurry may contain both chemicals and abrasives that aid in the removal of material from the wafer. After completion of the planarization process, the wafer is returned back through the transfer station to the proper cassette located in the bath.

Optionally, one of the planarization stations may be a buffing station. The buffing station also processes the wafer in a circular motion similar to the planarization station. The buffing station removes surface contamination, such as loosely adhered particles, so that the wafer may be cleaned more effectively after polishing in a cleaning module that may be located adjacent to or remotely from the CMP system.

As the planarization stations are circularly orientated about the carousel, the footprint of rotational polishers is generally compact. Compact, or small footprints, generally allow for more processing equipment to be utilized in process areas, and contribute to lower factory overhead and greater wafer throughput.

Another system disclosed in U.S. Pat. No. 5,908,530, issued Jun. 1, 1999, to Hoshizaki et al., which is hereby incorporated by reference, teaches an apparatus for planarizing wafers wherein the wafer is subjected to uniform velocity across the wafer surface with respect to the abrasive surface. The wafer's motion is provided by a first linear drive and a second linear drive configured to provide x/y motion to a wafer carrier coupled to one of the linear drives. In one aspect, the wafer can be moved in an orbital pattern.

A polishing head is coupled to the wafer carrier to retain the wafer during polishing. Generally, the wafer is positioned in the polishing head by a dedicated load cup that also receives the polished wafers from the polishing head after processing. The polishing head generally stands idle while finished wafers are removed from the load cup and replaced with unpolished wafers.

Since the wafer does not rotate during polishing, all the points on the wafer are subject to a uniform velocity relative to the polishing surface. The uniform velocity across the wafer surface coupled with a multi-programable lanarization pattern results in a uniform rate of material removal from the wafer surface. In addition, Hoshizaki et al. provides a number of optional routines that allow a user to fine tune material removal from the wafer.

The systems described above can generally utilize polishing pads with and without abrasive finishes. The polishing pads may be stationary or move relative to the wafer. Additionally, abrasive slurry, de-ionized water and other fluids may be delivered to the polishing pad during wafer processing.

While both the rotational and linear planarization systems have proven to be generally robust polishing platforms, the elimination of the dwell time associated with loading and unloading a polishing head would improve the routing time required to process each wafer, and yield a corresponding increase in wafer throughput. The increase in wafer throughput has an advantageous effect on both the manufacturing cost of the devices fabricated on the wafer, and the cost of ownership associated with the polishing system.

Therefore, there is a need in the art for an apparatus that provides higher throughput by minimizing the dwell times during wafer transfer between system components.

SUMMARY OF INVENTION

Generally, a chemical mechanical planarization system for processing a workpiece such as a semiconductor substrate or wafer is provided. In one embodiment, the planarization system includes a first polishing module having one or more polishing heads for retaining a workpiece and a staging module. A first set of load cups transfers the workpiece between the one or more polishing heads. A first robot has a workpiece gripper that facilitates transfer of the workpiece between the first set of load cups and the staging module.

In another embodiment, a planarization system includes one or more polishing modules and a rotational buffing module. Each polishing module and buffing module has one or more polishing heads for retaining a workpiece during processing. A staging module is used to facilitate transfer of workpieces into and out of the system. A plurality of load cups for transferring the workpiece to and from the polishing heads are positioned such that a robot may transfer workpieces between the load cups and the staging module.

In another aspect, a method for processing a workpiece is also disclosed. In one embodiment, the method comprises the steps of processing the workpiece on a first linear polishing module; and processing the workpiece on a rotational buffing module coupled to the first linear polishing module. In other embodiments, the comprises the steps of transferring the workpiece from a first load cup into a first polishing head; processing the workpiece; and transferring the workpiece from the first polishing head to a second load cup.

BRIEF DESCRIPTION OF DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION OF INVENTION

Figure 1:
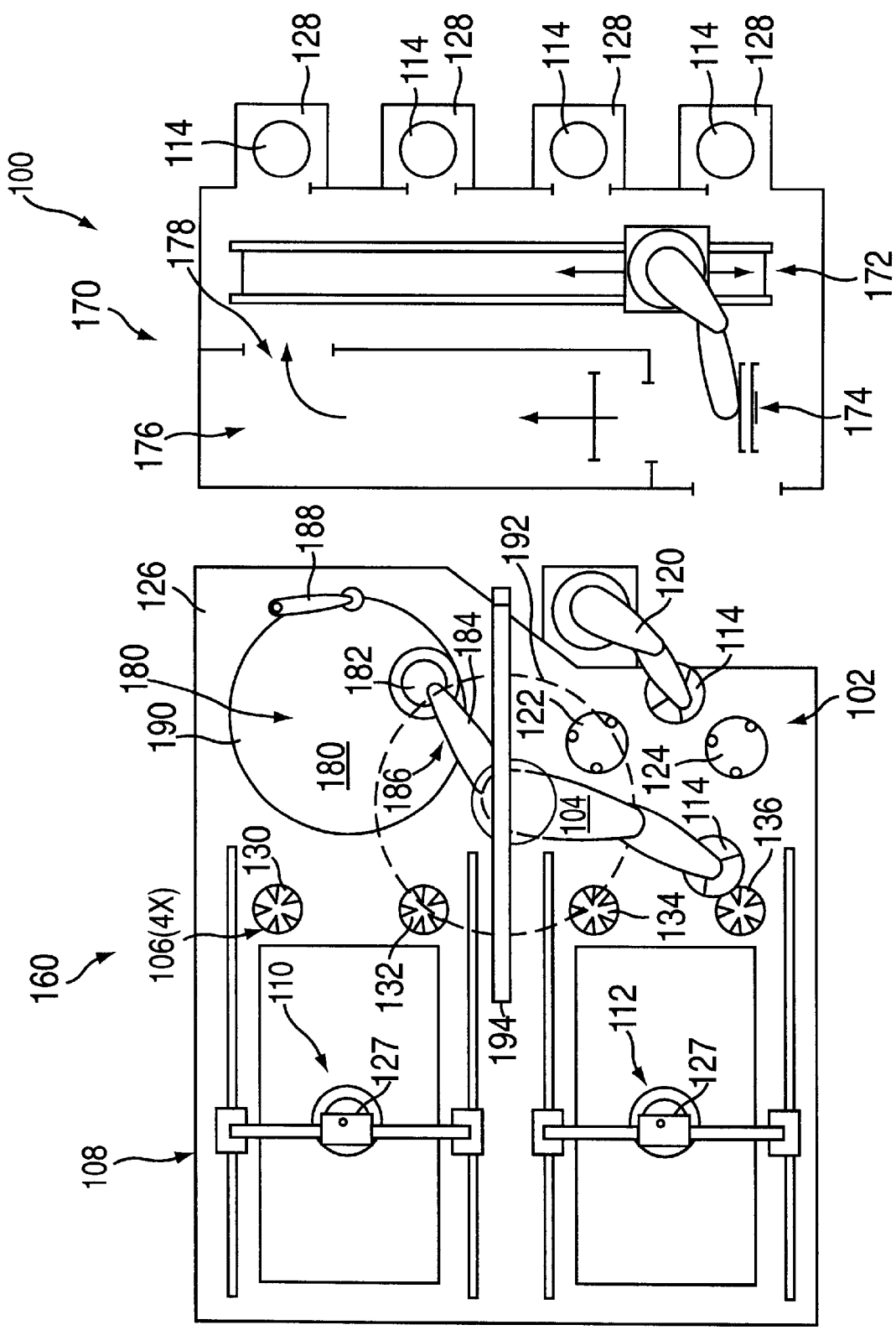
FIG. 1 is a schematic plan view of a chemical mechanical planarization system of the invention.
Figure 2:
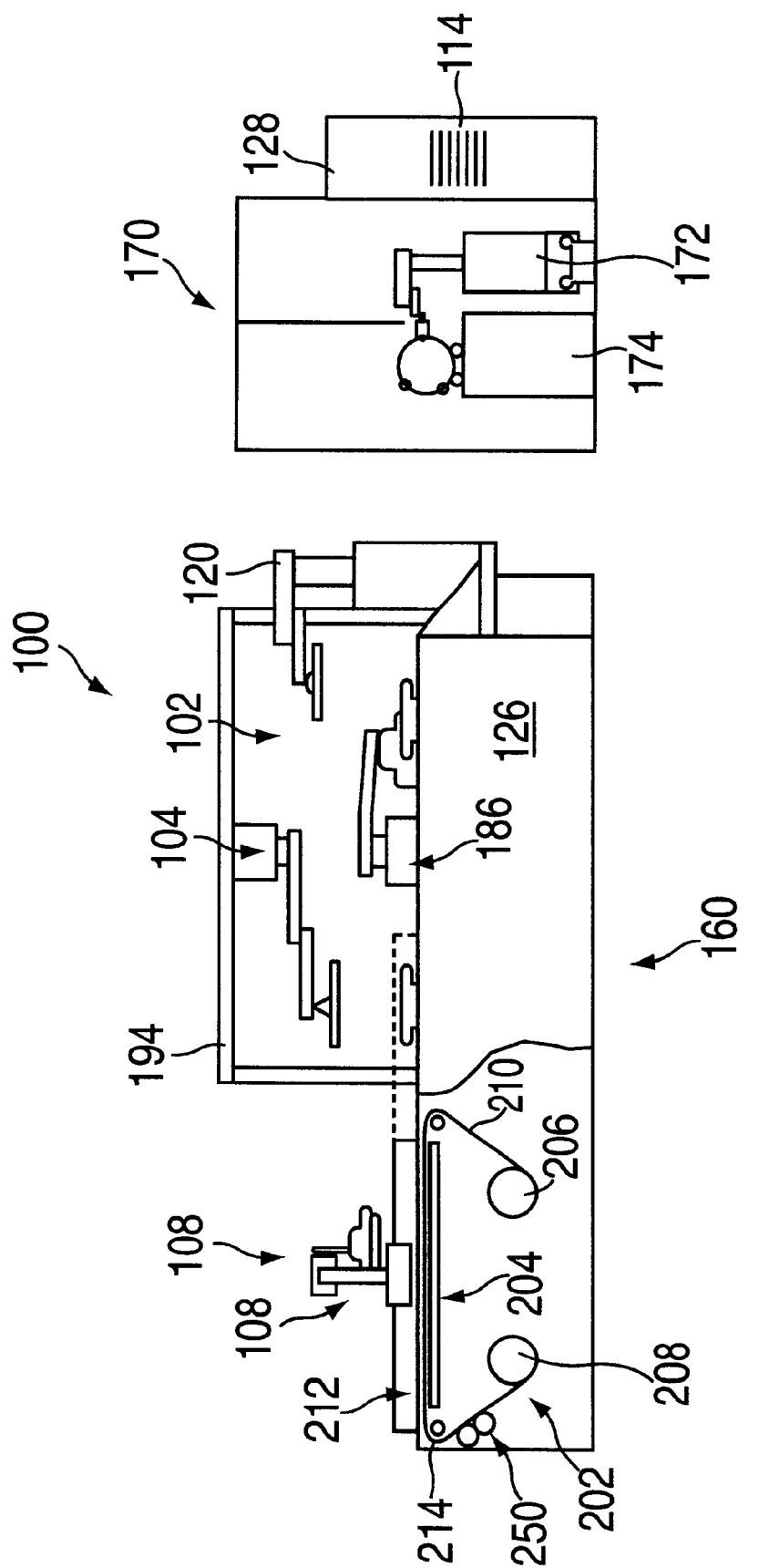
FIG. 2 is a schematic elevation of a chemical mechanical planarization system of FIG. 1.

FIGS. 1 and 2 depict a schematic plan view and an elevation of a chemical mechanical planarization system 100, respectively. The system 100 generally comprises factory interface module 170 and a processing module 160. Workpieces, such as semiconductor substrates or wafers 114 are transferred between the factory interface module 170 and the processing module 160 by a transfer robot 120.

The factory interface module 170 generally includes a cleaning module 176, a factory interface robot 172, an input module 174 and a plurality of wafer storage cassettes 128. The interface robot 172 is centrally located within the factory interface module 170 and has a range of motion that facilitates transfer of wafers between the wafer cassettes 128, the input modules 174 and an exit 178 of the cleaning module 176. A detailed description of an exemplary factory interface module 170 is described in U.S. patent application Ser. No. 09/547,189, filed Apr. 11, 2000, by Ettinger, which is hereby incorporated by reference in its entirety.

The processing module generally includes a staging module 102, a primary robot 104, a plurality of load cups 106 and one or more linear polishing modules 108 (depicted as a first linear polishing module 110 and a second linear polishing module 112).

Generally, the primary robot 104 is centrally located within the system 100. From this central location, the primary robot 104 may transfer workpieces such as semiconductor substrates or wafers 114 between the staging module 102 and the plurality of load cups 106. The load cups 106 transfer the wafers 114 into one or more polishing heads 127 within each of the polishing modules 108 for processing and receive processed wafers 114 from the polishing heads 127 when processing is complete. The staging module 102 provides a transfer platform and queuing area for wafers 114 coming from and returning to the factory interface module 170. Generally, the unprocessed wafer 114 is retrieved from one of a plurality of wafer storage cassettes 128 that interface with the factory interface module 170 and transferred to the staging module 102 by the transfer robot 120. The unprocessed wafer is then moved to one of the load cups 106 by the primary robot 104, and loaded into the polishing modules 108 for processing. The processed wafer 114 is returned to the cassette 128, typically passing through a cleaning module 176 disposed within the factory interface module 170 along the return path. In systems comprising more than one polishing module, the sequence and selection (or omission) of polishing modules may be selected to obtain a particular processing result on the wafer surface.

The plurality of load cups 106 are generally grouped into sets of load cups having at least one load cup positioned adjacent each polishing module. In the exemplary embodiment, a first set of load cups comprise at least two load cups, for example, a first load cup 130 and a second load cup 132. The first and second load cups (130 and 132) are disposed on the base 126 proximate the first linear polishing module 110. A second set of load cups comprises a third 134 and a fourth load cup 136. The third load cup 134 and the fourth load cup 136 are disposed on the base 126 proximate the second linear polishing module 112. The load cups 106 are positioned such that wafers 114 may be retrieved by both the primary robot 104 and polishing heads 127 of the polishing modules 108.

Typically, the load cups 106 are disposed on the base 126. The load cups 106 are stationary in the horizontal plane of the base 126 and may be actuated perpendicular to the base 126 when transferring substrates 112 with the polishing head 127.

The load cups 106 may comprise any variety of load cups known to those in the art for positioning wafers into a polishing head of a polishing module. Examples of such load cups are described in U.S. patent application Ser. No. 09/414,907, filed Oct. 8, 1999, by Tobin and in U.S. patent application Ser. No. 60/169,770, filed Dec. 9, 1999, by Sommer et al., both of which are hereby incorporated by reference. The load cups 106 may optionally comprise different styles of load cups.

The staging module 102 comprises at least a first platform 124 and second platform 122 and the transfer robot 120. Alternatively, the transfer robot 120 may be coupled to the factory interface module 170, suspended from an enclosure (not shown), or be free standing. The transfer robot 120 places the wafer 114 retrieved from the factory interface module 170 onto the first platform 124. The transfer robot 120 additionally returns processed wafers to the factory interface 170 from the second platform 122. One skilled in the art will appreciate that the first and second platforms 124, 122 are not limited to use solely with unpolished and polished wafers, respectively, and that either polished or unpolished wafers may be set upon either platform as needed.

The typical transfer robot 120 is a single blade robot having an edge contact gripper 314 coupled to the end of a pair of extendable arms by a rotary actuator. By actuating the gripper, the wafer 114 is retained by the transfer robot 120 during transfer between the cassette 128 and either the first platform 124 or second platform 122. The wafer 114 is generally flipped 180 degrees during transfer by the transfer robot 120 such that the wafer is orientated "feature side-down" when disposed or supported in the first platform 124 or second platform 122, and "backside-down" when in the cassette 128.

The first platform 124 and second platform 122 are coupled to the base 126 of the system 100 within the range of motion of the primary robot 104 such that the primary robot 104 may pick and place wafers from both the second platform 122 and first platform 124.

Figure 3:
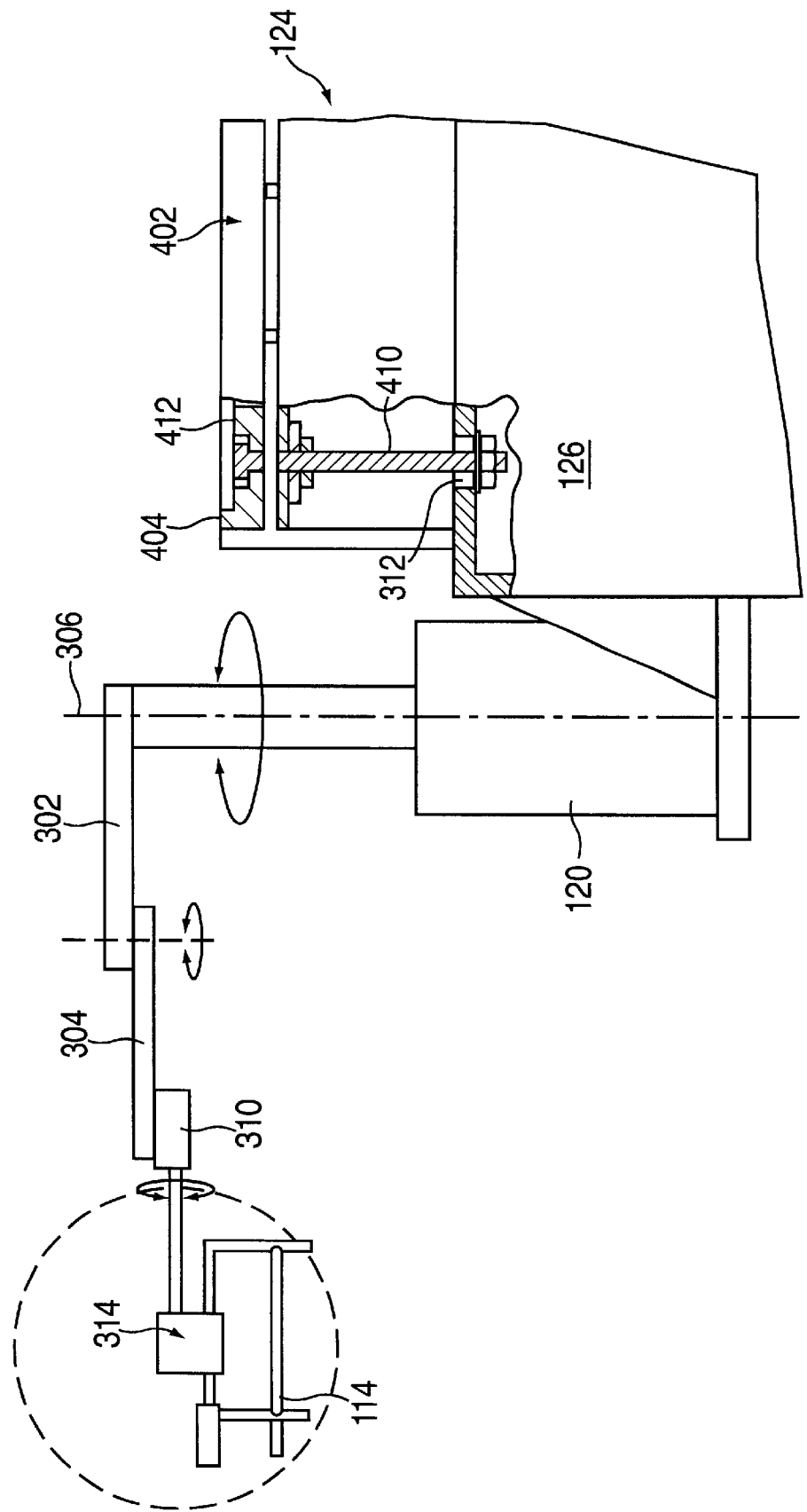
FIG. 3 is a plan view of a buffer.
Figure 4:
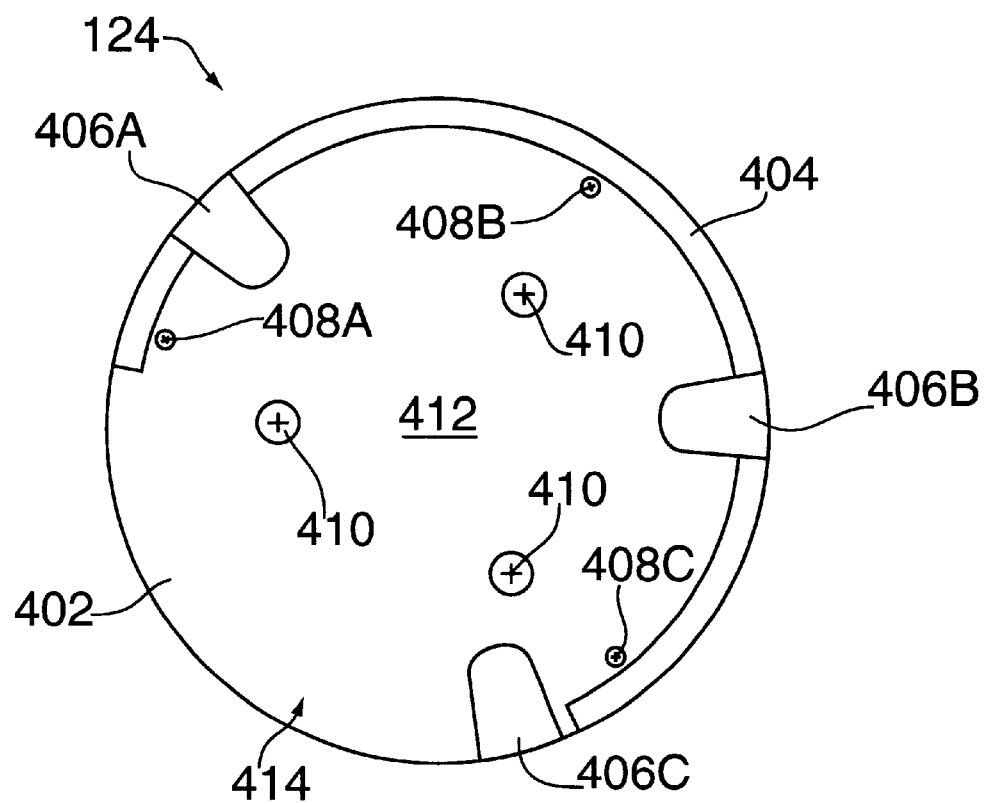
FIG. 4 is an elevation of a staging module depicting the buffer of FIG. 3.

FIGS. 3 and 4 depict the first platform 124 in elevation and plan views. The second platform 122 is substantially similar to the first platform 124. The first platform 124 comprises a wafer support 402 that is supported above a base 126 of the system 100. The wafer support 402 is bolted to the base 126 utilizing slots, or oversized holes 412 in the base 126 for receiving a bolt 410 to allow the wafer support 402 to interface with both the primary robot 104 and transfer robot 120. The wafer support 402 is circular and comprises a circumferential lip 404, three cut-outs 406A, 406B and 406C, mounting bolts 410, and wafer support pins 408A, 408B, and 408C. The circumferential lip 404 rises above the plane of a central portion 414 of the wafer support 402 such that a wafer will not slide off of the support when resting on the three wafer support pins 408A, 408B and 408C. There is a gap 414 in the lip 404 to permit access to the wafer support 402 by the transfer robot 120. The cut-outs 406A, 406B, and 406C are provided to enable the gripper fingers of the primary robot 104 to access a wafer 114.

The wafer rests above the plane of the central portion 412 upon pins 408A, 408B and 408C. The pins 408A, 408B and 408C typically are solid. Optionally, the pins may be hollow to allow a fluid (e.g., water) to be pumped through a pathway in the pins. The flow of water is monitored to detect flow change when a wafer is present. Such a change in flow is used to indicate when a wafer 114 is positioned on a staging module 102. The small fluid film between the wafer and the support pins ensures that the wafer does not contact the pin and thereby minimizes particle contamination to the wafer surfaces. A detailed description of the wafer detection technique is provided in the previously incorporated U.S. patent application Ser. No. 09/414,907.

The transfer robot 120 may comprise any number of robots known in the art capable of transferring the wafer between the storage cassette 128 to the wafer supports 402 of the staging module 102. Generally, as the staging module 102 maintains the wafer 114 in a "feature side-up" position, those cassettes 128 having wafers in a vertical position must utilize a transfer robot 120 (or pair of robots) that have a range of motion that allows the wafer to be rotated between a horizontal and vertical orientation.

In one embodiment, the transfer robot 120 comprises a first arm 302 coupled to a second arm 304 that provides radial motion substantially about 335 degrees about a central axis 306 of the transfer robot 120. A flat blade 308 is coupled to the second arm 304 by a rotary actuator 310. The blade 308 has a vacuum gripper to selectively retain the wafer in a horizontal and vertical orientation (depicted in phantom in FIG. 4) as the blade 308 is rotated by the actuator 310 and moved by the robot 120.

Returning to FIGS. 1 and 2, the primary robot 104 generally comprises a robot or other pick and place device capable of transferring the wafer 114 between the staging module 102 and the plurality of load cups 106. Typically, the primary robot 104 is positioned adjacent the staging module 102 and load cups 106 and suspended from a support 194. The support 194 may be coupled to the base 126 by one or more stanchions 196 or alternatively, the support 194 may be coupled an enclosure (not shown) that covers at least a part of the system 100.

Figure 5:
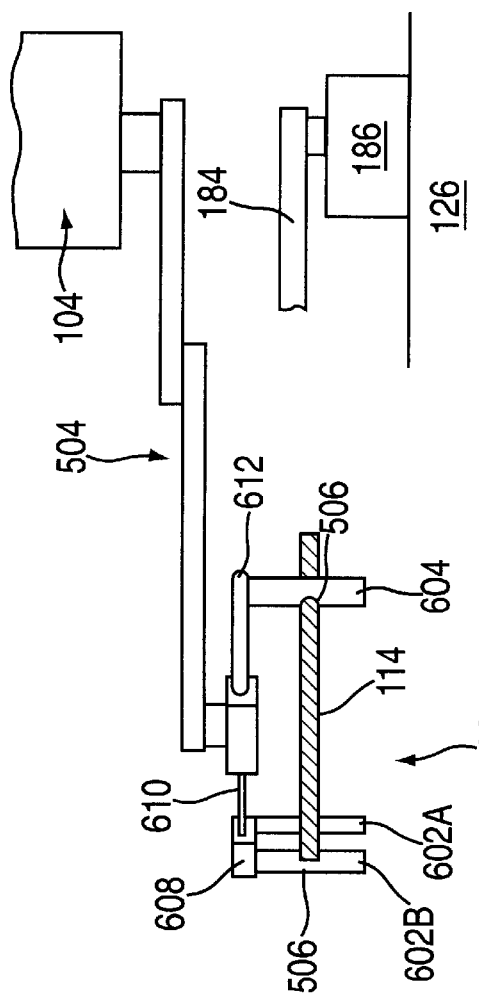
FIG. 5 is an elevation of a primary robot.
Figure 6:
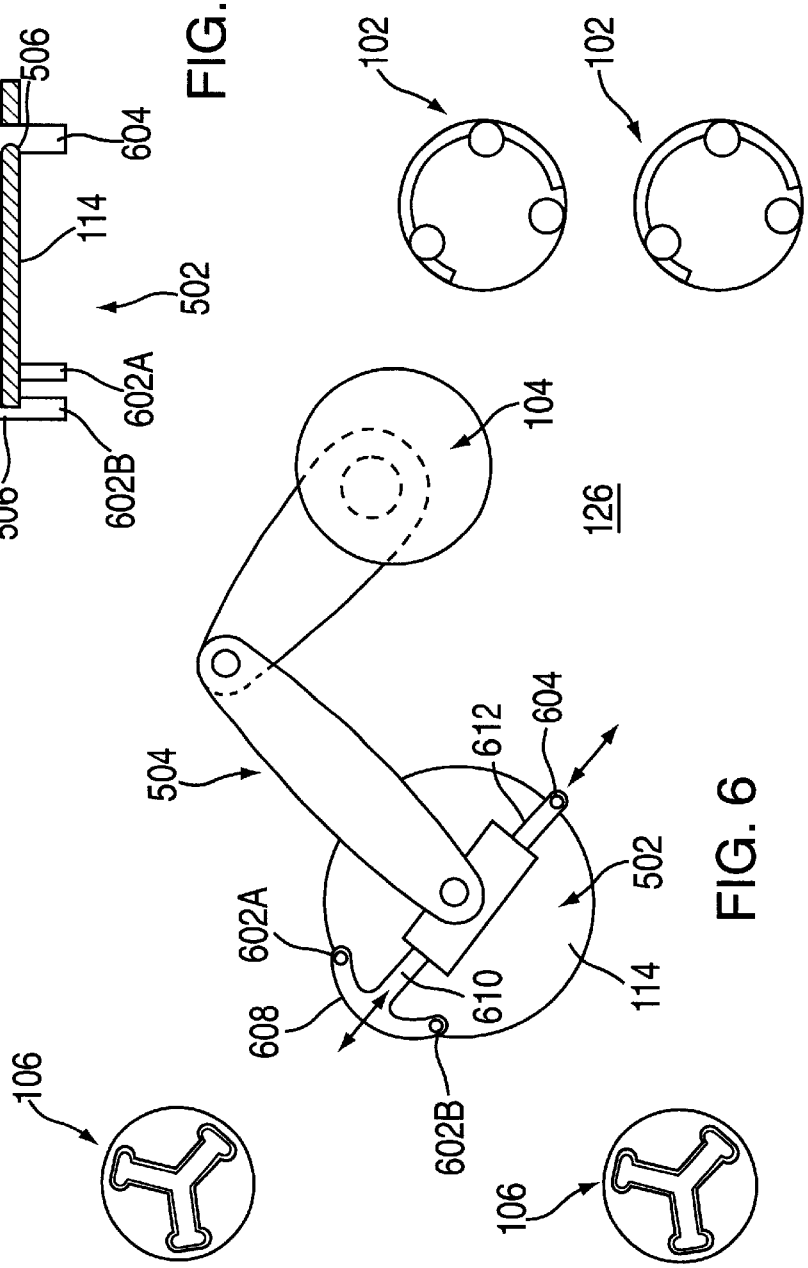
FIG. 6 is a plan view of the primary robot of FIG. 5.

FIGS. 5 and 6 depict one embodiment of a primary robot 104. The primary robot 104 generally comprises an edge gripper 502 at a distal end of an arm 504 of the primary robot 104. The edge gripper 502 has three gripping fingers 602A, 602B and 604. The gripping fingers 602A and 602B are disposed downwardly on a chevron shaped member 608 coupled to the edge gripper 502 via a first shaft 610. The gripping finger 604 is disposed downwardly and is coupled to the edge gripper 502 via a second shaft 612. Each finger has a cylindrical shape containing a notch 506 cut into a side of the cylinder. These notches 506 have an opening that is larger than the thickness of a wafer. Generally, the fingers are fabricated of a non-abrasive material such as plastic. An actuator (not shown) is coupled to the first shaft 610 and the second shaft 612 and moves the shafts inward and outward from the edge gripper 502. The shafts 610 and 612 are biased outwardly by springs (not shown) that normally maintain the fingers 602A, 602B and 604 apart from one another in an open position. In the open position, the spacing between the fingers 602A, 602B and 604 is larger than the diameter of the wafer 114 (e.g., 100, mm, 200 mm, or 300 mm). The actuator moves the shafts 610 and 612 inwardly to cause the fingers 602A, 602B, and 604 to grip and retain a wafer 114 in the notches 506 of the fingers.

An example of such an edge gripper 502 and wafer support 302 is described by Tobin in U.S. patent application Ser. No. 60/139,846, filed Jun. 18, 1999, which is hereby incorporated by reference in its entirety. Of course, one skilled in the art may readily substitute other grippers, robots, and wafer support within the scope of the invention.

Figure 7:
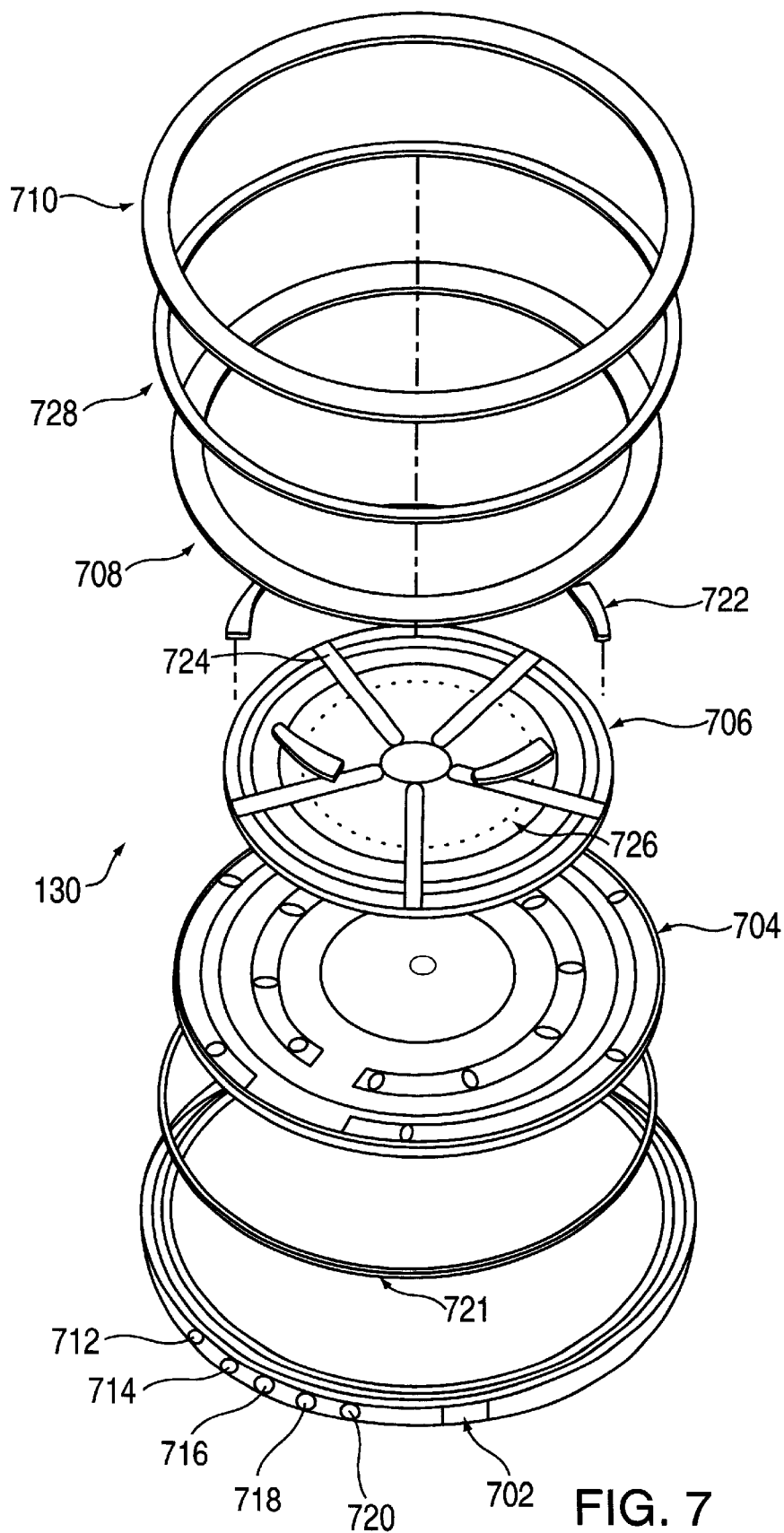
FIG. 7 is a simplified exploded view of a first load cup.

FIG. 7 is a simplified exploded view of the first load cup 130. The load cup 130 comprises a base ring 702, a pneumatic distribution plate 704, an insert pad 706, a capture ring 708, and a collar 710. The base ring 702 has a first port 712, a second port 714, a third port 716, a fourth port 718 and a fifth port 720 that are referred to collectively as ports 701. The pneumatic distribution plate 704 is disposed atop the distribution plate 702 and sealed by o-ring 721. The insert pad 706 is disposed atop the pneumatic distribution plate 704. The insert pad 706 includes a lift mechanism (i.e., plurality of lift fingers 722) and a centering mechanism (i.e., a plurality of centering finger 724). The centering fingers 724 project from the insert pad 724 and are set in a diameter that allows the wafer 114 to be set between the centering fingers 724. The pneumatic distribution plate 704 aligns with the ports 701 such that the first port 712 is coupled through the distribution plate 704 and insert pad 706 such that fluid applied to the first port 712 causes the centering fingers 724 to actuate inwards. Correspondingly, second port 714 is coupled through the distribution plate 704 and insert pad 706 such that fluid applied to the second port 714 causes the centering fingers 724 to actuate outwards. In such an outward position, a wafer may be set into the load cup 130, resting upon the insert pad 706.

The third port 716 is coupled through the distribution plate 704 and insert pad 706 such that fluid applied to the third port 716 causes the lift fingers 722 to actuate upwards from the insert pad 706. When the lift fingers 722 are set in such an extended position, a wafer set in the load cup 130 may be lifted concentrically to a position where the wafer may be retained by the processing head 127 or other conventional wafer handling device. Correspondingly, the fourth port 718 is coupled through the distribution plate 704 and insert pad 706 such that fluid applied to the fourth port 718 causes the lift fingers 722 to actuate towards the insert pad 706. Alternately, other lift mechanisms may be employed to lift the wafer, for example, lift pins and edge grip devices.

The first port 720 is coupled through the distribution plate 704 and insert pad 706 such that fluid applied to the fifth port 720 is distributed through a plurality of holes 726 arranged about the insert pad 706. When fluid is applied to the fifth port 720, the fluid exiting the plurality of holes 726 causes a wafer set upon the insert pad 706 to "float" upon a cushion of fluid, thus preventing damage during operations such as centering the wafer.

The capture ring 708 is disposed atop the insert pad 706 and retains the insert pad 706 to the load cup 130. Disposed above the capture ring 708 is the collar 710. The collar provides an entry for wafers to access the load cup 130 while additionally retaining wafers within the nest that may move laterally during shuttle 108 movement or when the wafer is floating on a cushion of fluid. An o-ring 728 seals the capture ring 708 to the collar 710.

Referring to FIG. 2, the polishing modules 108 may comprise buffing, polishing, rinsing, cleaning and/or other processes associated with planarizing a workpiece. Each of the polishing modules 108 (i.e., the first module 110 and the second module 112) comprise a polishing media magazine 202, a polishing table 204, and a drive system 206.

The polishing media magazine 202 generally comprises an unwind 206 and a winder 208. A web 210 of polishing media is run between the unwind 206 and the winder 208. The web 210 can be substantially "rolled-up" at either the unwind 206 and the winder 208, or partially wound on both the unwind 206 and the winder 208 such that various portions of the web 210 may be selectively exposed between the unwind 206 and the winder 208. The web 210 may be indexed or advanced, between or during wafer processing.

The web 210 of polishing media is generally comprised of a thin polymeric film having a working surface comprising either a polishing pad or fixed abrasive covering at least a portion of the width of the web 210. The polishing media should be substantially impermeable to the polishing fluid (i.e., a slurry, deionized water or other fluid media that assists in polishing). The working surface may optionally comprise an abrasive coating, finish, covering, texture or combination thereof.

A working region 212 of the web 210 is disposed on the polishing table 204 that is coupled to the base 126 of the system 100. The working region 212 of the web 210 is orientated in relation to the polishing table 204 such that a working surface 214 of the web 210 is on the side of the web 210 facing away from the polishing table 204. A nozzle 909 is disposed on the polishing table 204 adjacent each web 210 so an optional slurry or other fluid used during wafer processing may be disposed on the working surface 214 of the web 908. Optionally, the working surface 214 may comprise an abrasive coating, finish, covering and/or texture. An example of such a polishing media magazine configured to handle a single web which may be modified to benefit from the features of this invention is described in U.S. patent application Ser. No. 08/833,278, filed Apr. 4, 1997, by Donohue et al.

The polishing media magazine 202 may further comprise a conditioning device. Generally, the conditioning device comprises two rollers 250 driving in opposing directions that are selectively actuated against with the working surface 214 of the web 210 to condition the working surface. The conditioning device conditions (i.e., dresses) the working surface 214 of the web 210 to create a uniformly textured surface that removes material from the surface of the wafer 114 at a uniform rate. Other types of conditioning devices may optionally be utilized alone or in conjunction with the rollers 250. Examples of such devices are described in U.S. patent application Ser. No. 60/172,416, filed Dec. 17, 1999, by Sommer et al, and is hereby incorporated by reference.

Figure 8:
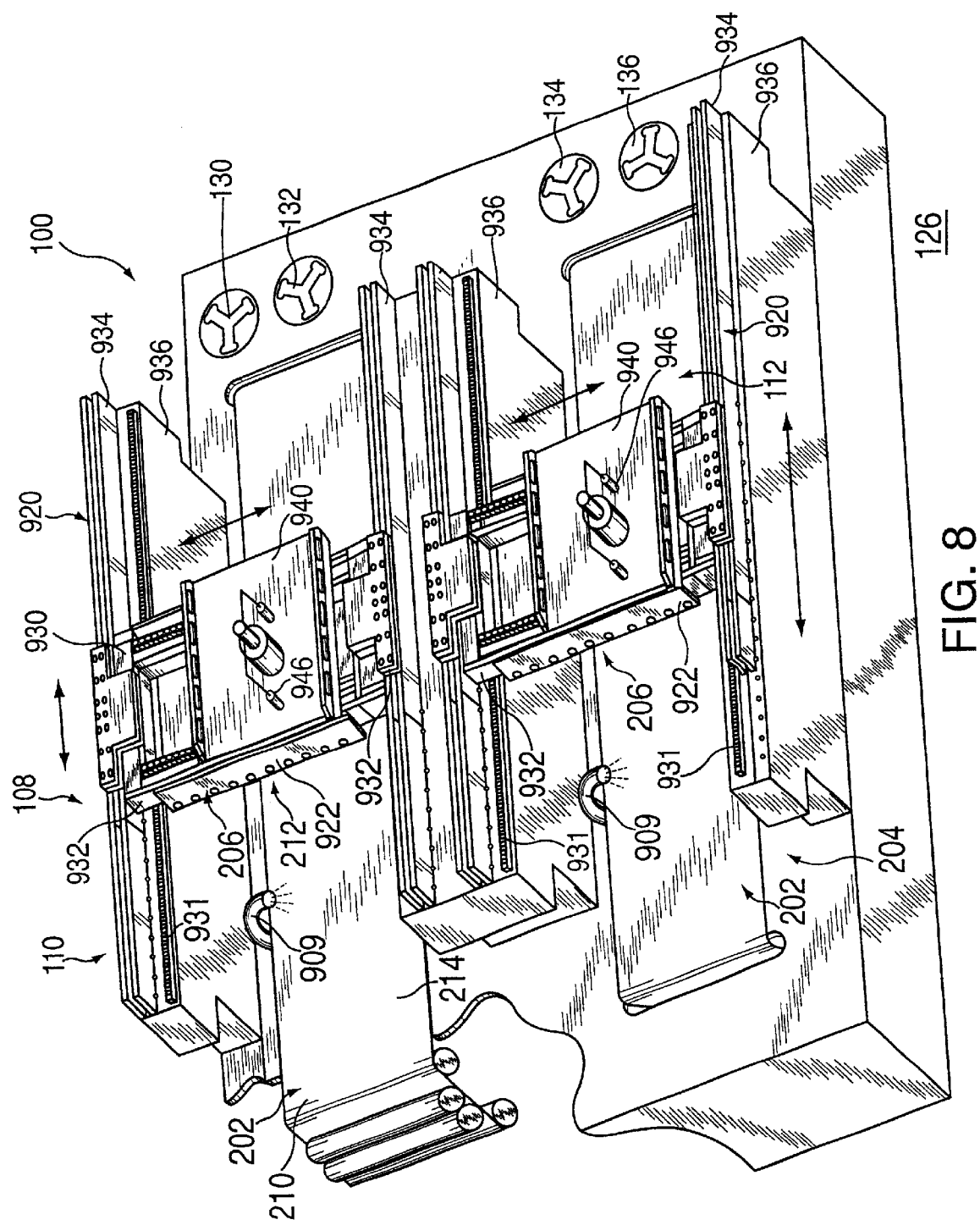
FIG. 8 is a perspective view of a drive system.
Figure 9:
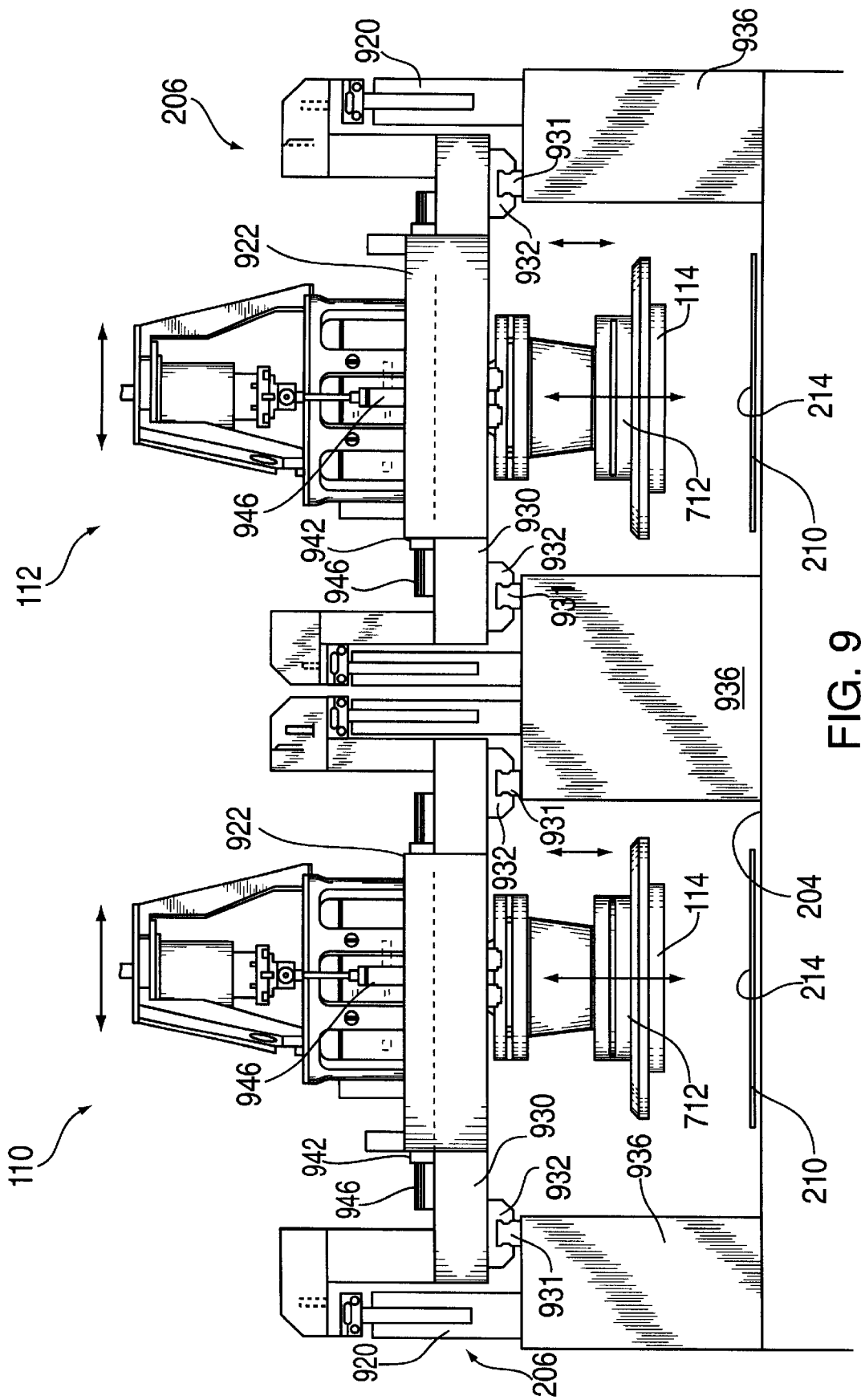
FIG. 9 is a side elevation of the drive system of FIG. 8.

FIGS. 8 and 9 are a perspective view and an elevation of one embodiment of the system 100 illustrating the drive system 206 found on each linear polishing module 110 and 112. The drive system 206 is coupled to the polishing table 204. The drive system 206 typically comprises a first linear motion device 920, a second linear motion device 922 and one or more polishing heads 127. The polishing head 127 is movably positioned above the working region 116 of the web 210. The first linear motion device 920 and the second linear motion device 922 (which could be replaced by one device providing at least an equivalent range of motion) couples the polishing head 127 to the polishing table 204. The linear motion devices 120 and 122 move the polishing head 127 in programmable pattern in relation to the polishing table. Optionally, more than one polishing head may be positioned on each drive system 206.

The first linear motion device 920 generally comprises a stage 930, a roller bearing guide 932 and a driver 934. The stage 930 is fabricated from aluminum or other light weight material. The stage 930 may comprise stiffening ribs to minimize the deflection in a direction normal the polishing table. The use of light weight materials minimizes the inertia of the stage 930 that effects stage motion. The guide 932 is coupled to the stage 930 and interfaces with a rail 931 disposed on a support 936 fixed to two sides of the polishing table 204. The support 936 adjacent each driver 206 may be combined into one shared support as shown. The guide 932 allows the stage 930 to move along the support 936 in a linear motion generally parallel to the length of the webs 908. The guide 932 may alternatively comprise solid bearings, air bearings or similar devices. The driver 934 provides motion to the stage 930 relative the polishing table. The drive may comprise "Sawyer" motors, ball screws, cylinders, belts, rack and pinion gears, servo motors, stepper motors and other devices for creating and controlling linear motion. Generally, one portion of the driver 934 is connected to the support 936 while a second portion is connected to the stage 930.

The second linear motion device 922 generally comprises a carrier 940, a roller bearing guide 942 and a driver 944. The carrier 940 is also fabricated from aluminum or other light weight material. The guide 942 is coupled to the carrier 940 and interfaces with a rail 946 disposed on stage 930. The guide 942 allows the carrier 940 to move along the stage 930 in a linear motion perpendicular to the motion of the stage 932. The guide 942 may alternatively comprise solid bearings, air bearings or similar bearing devices. The driver 944 provides motion to the carrier 940 relative the stage 930. The driver 944 may comprise "Sawyer" motors, ball screws, cylinders, belts, rack and pinion gears, servo motors, stepper motors and other devices for creating and controlling linear motion.

The carrier 940 further comprises one or more polishing heads 127. In one embodiment, the polishing head 127 is a Titan Head™ wafer carrier manufactured by Applied Materials, Inc., Santa Clara, Calif. The one or more polishing heads 127 are coupled to the carrier 940 in a position such that the polishing head 127 is disposed above the web 210. Each polishing head 127 is coupled to the carrier 940 via one or more actuators 946 that provides motion to the polishing heads 124 in a direction normal the working surface 214 of the web 210. The range of motion is such to allow a wafer 114 disposed in the polishing head 127 to contact the web 210.

An example of a linear drive system having a single web which may be modified to incorporate the advantages of the invention is described in U.S. patent application Ser. No. 08/961,602, filed Oct. 31, 1997, by Sommer.

FIG. 1 additionally depicts an optional buffing module 180 disposed on the base 126, generally adjacent at least one load cup (e.g., load cup 132) and the second platform 122. A buffing module robot 186 is coupled to the base 126 and is typically positioned concentrically beneath the primary robot 104. The buffing module robot 186 supports a polishing head 182 at a distal end of an arm 184 of the buffing module robot 186. Alternatively, the robot 186 and the primary robot 104 may be combined in a single robot having a substrate gripper and a head 182. The head 182 may be a Titon II™ polishing head available from Applied Materials, Inc. The buffing module robot 186 has a range of motion such that the polishing head 182 can be transported between the buffing module 180, the second platform 122 and the load cups 134, 132 of the adjacent linear polishing modules 112, 110 as depicted by dashed line 192.

The polishing head 182 is generally positioned by the buffing module robot 186 at either the load cups 132 or 134 such that the polished wafer 114 may be retrieved into the polishing head 182 for buffing. Once loaded with the wafer 114, the buffing module robot 186 moves the polishing head containing the wafer 114 over the buffing module 180. The polishing head 182 is lowered to contact the wafer 114 against a buffing pad 190 disposed in the buffing module 180 and proceeds to buff the wafer 114. In one embodiment, the buffing pad 190 and polishing head 182 rotates to rotationally buff the wafer 114. Typically, the buffing module 180 additionally comprises a conditioning device 188 that may be periodically disposed against the buffing pad 190 to condition the pad surface. An example of a rotational polishing station in which a buffing process may be performed is described by Tolles et al., in the previously incorporated U.S. Pat. No. 5,738,574.

Figure 10:
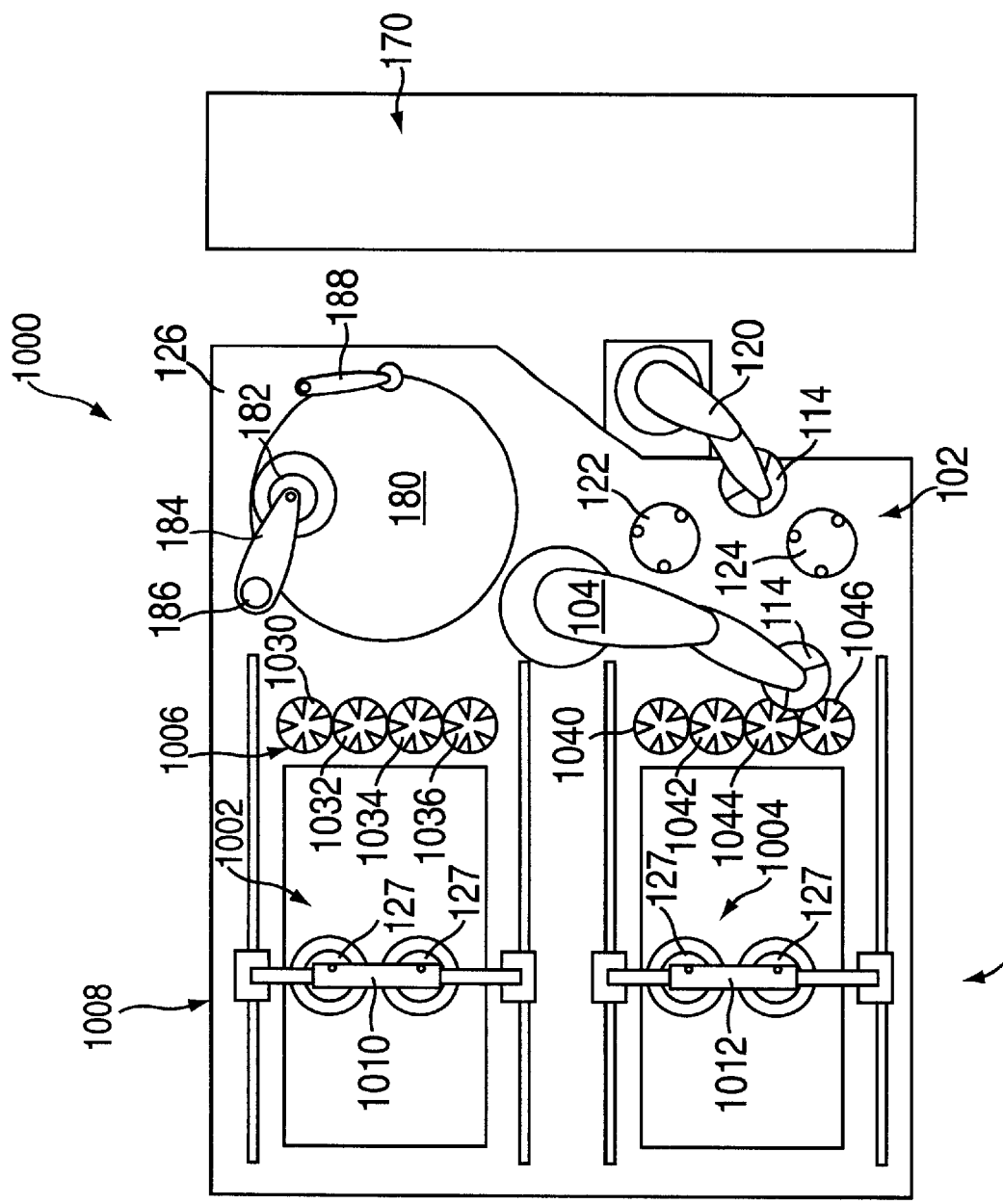
FIG. 10 is a schematic plan view of another embodiment of a chemical mechanical planarization system of the invention.

FIG. 10 depicts a schematic plan view of another embodiment of a chemical mechanical planarization system 1000. The system 1000 generally comprises a factory interface module 170, a processing module 1060 and a transfer robot 120 that transfers wafers 114 between the interface module 170 and the processing module 1060. The factory interface module 170 is substantially similar to the interface module 170 as described above with reference to FIGS. 1 and 2. The processing module 1060 generally includes a staging module 102, a primary robot 104, a plurality of load cups 1006 and one or more linear polishing modules 1008 (depicted as a first linear polishing module 1002 and a second linear polishing module 1004). Generally, the system 1000 is similarly configured relative the system 100 depicted in FIGS. 1 and 2. The first polishing module 1002 of the processing module 1060 includes a first carrier 1010 that has at least two polishing heads 127. The polishing module 1004 includes a second carrier 1012 that has at least two polishing heads 127. The polishing heads 127 retain wafers 114 such that multiple wafers may be processed simultaneously, thus increasing wafer throughput.

The load cups 1006 transfer the wafers 114 into one or more polishing heads 127 within each of the polishing modules 1008 for processing and receives processed wafers 114 from the polishing heads 127 when processing is complete. Generally, the load cups 1006 include at least one load cup per each polishing head 127 of each polishing module 1010, 1012. In one embodiment, the processing module 1080 includes load cups 1030 and 1032 for transferring unpolished wafers into the first polishing module 1010, and load cups 1034 and 1036 for receiving polished wafers from the first polishing module 1010. The processing module 1080 also includes load cups 1040 and 1042 for transferring unpolished wafers into the second polishing module 1012, and load cups 1044 and 1046 for receiving polished wafers from the second polishing module 1012.

Referring to FIGS. 1 and 2, in operation, the factory interface robot 172 retrieves the wafer 114 from one of the wafer cassettes 128 and transfers the wafer 114 to the input module 174. The transfer robot 120 retrieves the wafer 114 from the input module 174 and transfers the wafer 114 to the first platform 124. Once the wafer 114 is removed from the first platform 124 by the transfer robot 104, the transfer robot may retrieve another wafer from the input module 174 and reload the first platform 124. Polished wafers present in the second platform 124 are offloaded by the transfer robot 120 and returned to the cassette 128 after passing through the cleaning module 176.

The primary robot 104 retrieves the wafer 114 from the first platform 124 and transfers the wafer to one of the plurality of load cups 106. In the exemplary embodiment, the wafer 114 is transferred to the first load cup 130. The first polishing module 108 retrieves the wafer 114 residing in the first load cup 130 by moving the polishing head 127 above the first load cup 130. From this position, the polishing head 127 is lowered to mate with the first load cup 130 to insure wafer alignment in the first load cup 130 after wafer transfer. The wafer 114 is moved over the working region 212 of the web 210. The polishing head 127 is lowered to contact the wafer 114 against the working surface 214 of the web 210. The driver 206 of the first linear polishing module 110 moves the wafer 114 in a programmed polishing pattern to planarize the wafer 114. Optionally, a slurry or other fluid may be disposed between the wafer 114 and the web 210 through the nozzle 909. The process of linearly polishing a wafer is described by Hoshizaki et al., in the previously incorporated U.S. Pat. No. 5,908,530.

Upon completion of processing, the wafer 114 is transferred from the first polishing module 110 to the second load cup 132. If another wafer is waiting in the first load cup 130, that wafer is retrieved for processing in the first processing module 110 following the release of the processed wafer 114 into the second load cup 132. The use of the two load cups to facilitate loading and offloading of the polishing module increases the throughput of the system 100.

The processed wafer 114 is retrieved from the second load cup 132 by the primary robot 104 and transferred to another processing module (i.e., the second processing module 112 or the optional buffing module 180). If the processed wafer 114 is to undergo further processing by the second processing module 112, the wafer 114 is transferred to the third load cup 134.

From the third load cup 134, the wafer 114 is retrieved by load cup 124 of the second processing module 112. The wafer 114 is transported over the web 210 of the second processing module 112 and is processed as described above. Upon completion of processing, the processed wafer is transferred to the fourth load cup 136. If another wafer is waiting to be processed in the third load cup 134, the load cup 124 retrieves the waiting wafer from the third load cup 134 after releasing the polished wafer to the fourth load cup 136.

If the processed wafer 114 is to be processed by the staging module 180, the polishing head 182 then is moved by the buffing module robot 186 into a position above the fourth load cup 136. The wafer 114 is transferred from the fourth load cup 136 to the polishing head 182. The polishing head 182 is positioned by the buffing module robot 186 above the buffing module 180 and lowered to place the wafer 114 in contact with the rotating buffing pad 190 (typically in the presence of a slurry or other fluid media such as deionized water that may form a layer separating the buffing pad from the wafer) in the buffing module 180. During buffing, the wafer 114 is typically rotated by the polishing head 182 as the buffing pad 190 is rotated beneath the wafer 114. The process of rotationally polishing a wafer is described by Perlov et al., in the previously incorporated U.S. Pat. No. 5,804,507. Upon completion of processing within the rotational buffing module, the wafer is transferred to the load cup from which the wafer was retrieved. Alternatively, the wafer may be transferred to load cup other than the one it was retrieved from prior to buffing.

Once no further processing is contemplated on the system 100, the processed wafer 114 is retrieved by the primary robot 104 from the load cup 106 in which the processed wafer 114 resides. The wafer 114 is placed upon the second platform 124. From the second platform 124, the processed wafer 114 is offloaded from the processing module 180 by the transport robot 120 to the factory interface module 170 where the wafers 114 is placed into the cassette 128. As multiple staging platforms (i.e., multiple buffers and load cups) are provided to facilitate the exchange of processed and unprocessed workpieces between the primary robot and the processing modules, and the primary and transfer robot, increased throughput through the system 100 can be realized by the minimization of dwell time experienced by the various system components during wafer exchange.

The above described routing of the wafer 114 through the system 100 is but one example of a possible processing sequence for a wafer 114 to be processed by the system 100. Alternatively, the wafer 114 may be processed by one or more processing modules or buffing stations, may be processed by the same module or station more than once, may be returned to the cassette during processing and subsequently retrieved into the system 100 for additional processing at a later time, or processed using another processing sequence.

Although the teachings of the present invention that have been shown and described in detail herein, those skilled in the art can readily devise other varied embodiments that still incorporate the teachings and do not depart from the scope and spirit of the invention.

What is claimed is:

1. A semiconductor wafer planarization system for processing a workpiece comprising:
    a base
    a first linear polishing module coupled to the base and having one or more polishing heads for retaining a workpiece;
    a staging module coupled to the base;
    a first set of load cups disposed between the staging module and the first linear polishing module, the first set of load cups comprising at least one input load cup and one output load cup respectively coupled to the base at a fixed distance from the first linear polishing module for transferring the workpiece with the polishing head; and
    a first robot having a workpiece gripper for transferring the workpiece between the first set of load cups and the staging module.

2. The planarization system of claim 1 further comprising:
    at least a second polishing module having a polishing head; and
    at least a second set of load cups for transferring the workpiece between the polishing head wherein the workpiece is accessible to the workpiece gripper of the first robot.

3. The planarization system of claim 2, wherein the first polishing module comprises two polishing heads, the first set of load cups comprises four load cups, the second polishing module comprises two polishing heads and the second set of load cups comprises four load cups.

4. The planarization system of claim 1, wherein the staging module comprises:
    a first staging platform; and
    a second staging platform disposed adjacent the first staging platform.

5. The planarization system of claim 4, wherein the staging module further comprises a transfer robot for transferring workpieces between the first staging platform, the second staging platform and a factory interface having one or more storage cassette.

6. The planarization system of claim 5, wherein the transfer robot further comprises an edge gripper.

7. The planarization system of claim 1 wherein the first set of load cups comprises a first load cup and a second load cup.

8. The planarization system of claim 1 wherein the first polishing module comprises:
    a polishing table;
    a drive system movably coupled to the polishing table, the polishing head coupled to the drive system of the first polishing module; and
    a web of polishing media disposed upon the polishing table.

9. The planarization system of claim 8, wherein the drive system comprises:
    a first linear motion device movably coupled to the polishing table; and
    a second linear motion device movably coupled to the first linear motion device, the polishing head coupled to the second linear motion device of the drive system.

10. The planarization system of claim 1, wherein the first robot is suspended above the load cups.

11. The planarization system of claim 1 further comprising:
    a rotational buffing module; and
    a buffing module robot wherein the buffing module robot is positioned to transfer the workpiece between the rotational buffing module and at least one of the load cups.

12. The planarization system of claim 10 further comprising:
    a base supporting the load cups and buffing module robot, wherein the first robot is suspended above the buffing module robot.

13. The planarization system of claim 11 further comprising:
    a second polishing module having a polishing head;
    a second set of load cups comprising a first load cup and a second load cup, the first and second load cups for transferring the workpiece between the polishing head of the second polishing module; wherein the buffing module robot transfers the workpiece between one load cup of the first set of load cups, the first load cup of the second set of load cups and the staging module.

14. A semiconductor wafer planarization system for processing a workpiece comprising:
    one or more linear polishing modules having at least one polishing head for retaining the workpiece;
    at least one load cup for transferring the workpiece to and from the polishing head;
    a rotational buffing module;
    a buffing module robot positioned to transfer the workpiece between the buffing module and the load cup;

a staging module; and a first robot having a workpiece gripper positioned to transfer the workpiece between the load cup and the staging module.

15. The planarization system of claim 14, wherein the at least one load cups further comprises:

at least one load cup for loading the polishing head of the one or more polishing modules; and at least a second load cup for loading the polishing head of the buffing module.

16. The planarization system of claim 14, wherein the staging module comprises:

a first staging platform;

a second staging platform disposed adjacent the first staging platform; and a transfer robot for transferring the workpieces between the first staging platform, the second staging platform and a factory interface having one or more storage cassette.

17. The planarization system of claim 14, wherein the one or more polishing module comprises:

a first polishing module; and a second polishing module, wherein the first polishing module and the second polishing module each further comprise two polishing heads.

18. The planarization system of claim 17, wherein the at least one load cup further comprises:

a set of four load cups disposed adjacent the first polishing module for transferring workpieces between the polishing heads of the first polishing module; and a second set of four load cups disposed adjacent the second polishing module for transferring workpieces between the polishing heads of the second polishing module.

19. The planarization system of claim 14 further comprising:

an input module from which the workpiece may be retrieved by the first robot;

a cleaning module disposed adjacent the input module;

one or more workpiece storage cassettes; and an interface robot for transferring workpieces between the cleaner and the cassettes, and the cassettes and the input module.

20. The planarization system of claim 19, wherein the first robot first robot is suspended above a base.

21. The planarization system of claim 14, wherein the buffing module further comprises a rotating buffing pad.

22. A semiconductor wafer planarization system for processing a workpiece comprising:

a base;

a first linear polishing module coupled to the base and having one or more polishing heads for retaining a workpiece;

a staging module coupled to the base;

a first set of load cups fixed to the base adjacent the first linear polishing module for transferring the workpiece between the polishing head;

a first robot having a workpiece gripper for transferring the workpiece between the first set of load cups and the staging module;

a rotational buffing module; and a second robot having a workpiece gripper disposed below the first robot, the second robot for transferring the workpiece between the first set of load cups and the buffing module.

23. The planarization system of claim 22, wherein the first and second robots are disposed concentrically.

24. The planarization system of claim 23, wherein the at least one load cups further comprises:

at least one load cup for interfacing with the polishing head and the first robot; and at least a second load cup for interfacing with the polishing head and the second robot.

25. The planarization system of claim 23, wherein the staging module comprises:

a first staging platform;

a second staging platform disposed adjacent the first staging platform; and a transfer robot for transferring the workpieces between the first staging platform, the second staging platform and a factory interface having one or more storage cassette.

26. The planarization system of claim 23, wherein the one or more polishing module comprises:

a first polishing module; and a second polishing module, wherein the first polishing module and the second polishing module each further comprise two polishing heads.

27. The planarization system of claim 23 further comprising:

an input module from which the workpiece may be retrieved by the first robot;

a cleaning module disposed adjacent the input module;

one or more workpiece storage cassettes; and an interface robot for transferring workpieces between the cleaner and the cassettes, and the cassettes and the input module.

* * * * *

UNITED STATES PATENT AND TRADEMARK OFFICE
CERTIFICATE OF CORRECTION

PATENT NO. : 6,435,941 B1
DATED : August 20, 2002
INVENTOR(S) : White

It is certified that error appears in the above-identified patent and that said Letters Patent is hereby corrected as shown below:

<u>Title page,</u>
Item [73], Assignee, please change "Appllied" to -- Applied --.

<u>Column 2,</u>
Line 11, please change "lanarization" to -- planarization --.

Signed and Sealed this

Thirtieth Day of September, 2003

JAMES E. ROGAN
*Director of the United States Patent and Trademark Office*